United States Patent [19]
Ohmi et al.

[11] Patent Number: 5,516,626
[45] Date of Patent: May 14, 1996

[54] RESIST PROCESSING METHOD

[75] Inventors: Tadahiro Ohmi, 1-17-301, Komegakubo 2-chome, Aoba-ku, Sendai-shi, Miyagi-ken 980; Tohru Nonaka, Tokuyama; Motonobu Horikoshi, Gunma; Masanobu Onodera, Miyagi, all of Japan

[73] Assignee: Tadahiro Ohmi, Sendai, Japan

[21] Appl. No.: 296,276

[22] Filed: Aug. 25, 1994

Related U.S. Application Data

[63] Continuation of Ser. No. 949,494, Nov. 20, 1992, abandoned.

[30] Foreign Application Priority Data

Apr. 23, 1990 [JP] Japan .................................. 2-106815
Jun. 20, 1990 [JP] Japan .................................. 2-161554

[51] Int. Cl.$^6$ .......................... G03C 5/00; G03C 5/04; H01L 21/306; H01L 21/324
[52] U.S. Cl. .......................... 430/328; 430/327; 430/330; 430/494; 430/269; 437/174; 437/247; 437/949
[58] Field of Search .................................. 430/269, 327, 430/330, 494, 328; 355/18, 30, 77; 437/174, 247, 949

[56] References Cited

U.S. PATENT DOCUMENTS

| 3,887,440 | 6/1975 | Ichioka | 204/13 |
| 4,615,776 | 10/1986 | Sasaki et al. | 204/129.1 |
| 4,765,055 | 8/1988 | Ozaki et al. | 29/599 |
| 4,786,947 | 11/1988 | Kosugi et al. | 355/30 |

FOREIGN PATENT DOCUMENTS

| 0415412 | 3/1991 | European Pat. Off. | 430/330 |
| 3940405 | 6/1990 | Germany | 430/327 |
| 4200038 | 10/1992 | Germany | 430/330 |
| 56-111221 | 9/1981 | Japan . | |
| 60-45247 | 3/1985 | Japan . | |
| 0020331 | 1/1986 | Japan | 430/330 |
| 0166130 | 7/1986 | Japan | 430/330 |
| 62-69613 | 3/1987 | Japan . | |
| 0129849 | 6/1987 | Japan | 430/330 |
| 62-157722 | 7/1987 | Japan . | |
| 63-52410 | 3/1988 | Japan . | |
| 0062323 | 3/1988 | Japan | 430/330 |
| 63-56915 | 3/1988 | Japan | 437/174 |
| 63-92021 | 4/1988 | Japan . | |
| 63-115336 | 5/1988 | Japan . | |
| 63-133627 | 6/1988 | Japan . | |
| 63-220523 | 9/1988 | Japan . | |
| 3232331 | 9/1988 | Japan . | |
| 63-232332 | 9/1988 | Japan . | |
| 63-234527 | 9/1988 | Japan . | |
| 63-232330 | 9/1988 | Japan . | |
| 63-260028 | 10/1988 | Japan . | |
| 63-237418 | 10/1988 | Japan . | |
| 0015926 | 1/1989 | Japan | 430/494 |
| 1-40215 | 2/1989 | Japan . | |
| 2-10363 | 1/1990 | Japan | 430/494 |
| 2-85437 | 7/1990 | Japan . | |

Primary Examiner—Charles L. Bowers, Jr.
Assistant Examiner—J. Pasterczyk
Attorney, Agent, or Firm—Baker & Daniels

[57] ABSTRACT

The present invention relates to a resist processing device and resist processing method that enable resist pattern formation with a high degree of accuracy, and furthermore, enable in continuous dry etching, an isotropic etching possessing extremely high selectivity. The resist processing device is provided with at least a mechanism for the radiation of ultraviolet rays onto a substrate having a resist formed thereon, and a mechanism for the introduction of inert gas into the device. The resist processing method is characterized in that the radiation of ultraviolet rays onto a substrate which has a resist form thereon is conducted in an inert gas atmosphere.

8 Claims, 6 Drawing Sheets

RESIST PROCESSING METHOD

This is a continuation of application Ser. No. 07/949,494, filed Nov. 20, 1992, now abandoned.

BACKGROUND OF THE INVENTION

The present invention relates to a resist processing device, resist processing method, and resist pattern, and more particularly relates to a resist processing device, resist processing method, and resist pattern which make possible the formation of a resist pattern with a high degree of accuracy, and furthermore, make possible, during successive dry etching, anisotropic etching having an extremely high degree of selectivity.

In recent years, the development of LSI manufacturing technology has been striking, and development continues to be made in this area. This continuation of development is due in large part to advancements made in the photolithograph processing technology used to form resist patterns with extremely small dimensions.

A standard photolithographic procedure is shown in FIG. 1. In the etching process shown in the diagram, dry etching, and particularly reactive ion etching (RIE) are currently widely used for the formation of extremely fine patterns, and by means of this, extremely fine patterns on the submicron or half-micron level can be accurately etched.

However, in cases in which the reactive ion etching method was used to form a resist pattern by means of the process shown in FIG. 1, the resist pattern which forms the mask of the etching was also exposed to strong ion plasma, and furthermore, for that reason, localized areas of high temperature formed. As a result, defects such as a loosening of the pattern as a result of the heat of the resist, pattern deficiencies resulting from physical shock, and the like, were observed.

In order to prevent such problems, the development of a resist with improved heat resistance and plasma resistance has been desired.

Furthermore, from the processing side, as well, a method known as the UV (abbreviation of "ultraviolet") curing method has been used in place of the post-bake shown in FIG. 1; herein, the resist pattern is irradiated with ultraviolet rays. In this method, by means of the multiplier effect of the irradiation action of the ultraviolet rays and the heating action thereof, the crosslinking degree of the resist resin is increased, and by means of this, the resist is cured, and the heat resistance and plasma resistance thereof are increased. A photolithographic process using this UV cure method is shown in FIG. 2.

However, in the case in which a resist pattern is formed using the process shown in FIG. 2 and RIE is conducted, in comparison with the case shown in FIG. 1, RIE etching having a higher degree of accuracy can be conducted however, with respect to extremely fine etching in which the scale of the pattern is on the submicron level, it has become clear that etching cannot be conducted while preserving a high degree of selectivity.

For the above reasons, using the present LSI manufacturing technology, it is difficult, by means of dry etching, to obtain a fine etching pattern which has no surface contamination, is free of flaws and has high selectivity.

It is an object of the present invention to provide a resist processing device, resist processing method, and resist pattern which make possible the prevention of the various etching pattern defects and contamination caused by degassing from the resist at the time of dry etching, and which make possible the formation of an etching pattern with a high degree of selectivity and high accuracy.

SUMMARY OF THE INVENTION

The resist processing device of the present invention is characterized in that it is provided with at least a mechanism for the radiation of ultraviolet rays onto a substrate on which a resist is formed, and a mechanism for the introduction of an inert gas into the interior part of the device.

The resist processing method of the present invention is characterized in that the radiation of ultraviolet rays onto a substrate on which a resist is formed is conducted in an inert gas atmosphere.

The resist pattern of the present invention is characterized in that the degassing amount of the solvent from the resist is less than 0.5% when converted by the relative ion intensity ($I_R$) detected by means of an atmospheric pressure ionization mass spectrometer at a temperature of 230° C.

Hereinbelow, the functions of the present invention will be explained, along with the knowledge obtained at the time of the creation of the present invention.

With the object of creating a superfine pattern by means of dry etching, and in order to remove impurities such as particles and the like which cause defects, the present inventors have conducted research into the mirror finishing of the inner surface of the etching chamber so as to eliminate the processing converted layer by means of electrolytic polishing, supercleaning by means of oxide passive state processing technology in an extremely pure oxygen atmosphere, and the supercleaning and superpurification of the gas which is introduced.

However, in order to obtain a completely controlled superfine pattern, it is necessary not merely to clean the introduced gas to a high degree, but also to clean to a high degree the atmosphere in which the etching proceeds, and the present inventors have discovered that it is the degassing component from the resist material itself which contributes most to the contamination of this atmosphere.

The present inventors have conducted research into the limiting of this degassing component from the resist by means of an atmospheric pressure mass spectrometer As a result thereof, it was discovered that the degassing component from the resist comprises the three elements, stated below. That is to say, the first of these is a moisture component, the second is the solvent of the resist, and the third is the resist resin itself.

Furthermore, as a result of conducting an analysis of the degassing components from the resist by means of an analysis in which the temperature was gradually raised, it was discovered that moisture does not degas to an extent which is surprising for a high molecular resin, that the solvent component remains in large amounts even after post-baking at, for example, the normally employed setting temperature of 130° C., and accounts for almost all of the degassing component from the resist, and that the degassing generation temperature of the resin component itself from the resist is almost identical with the temperature at which heat loosening of the resist pattern occurs.

Furthermore, as a result of the continuation of experimentation, the present inventors have determined that it is possible to set the degassing value of the solvent component from the resist to 0 by baking the resist at a temperature which is greater than that of the boiling temperature of the solvent. However, at the time of baking at a temperature which is greater than that of the boiling temperature of the solvent, the resist pattern has a pattern cross sectional shape which is rounded in a semicylindrical form as a result of heat flow.

For example, the heat flow generation temperature of a resist which is generally used in present LSI processes, for example, a G ray positive type resist (phenol novolak resin) is roughly 130° C.–150 in a normal post-bake. Furthermore, an example of a solvent having good spin application characteristics in an atmosphere of air at 23° C. is, for example, ethylene glycol monoethyl ether acetate (trademark name: Ethyl Celsolve Acetate, referred to hereinafter as "ECA"); the boiling point thereof is 156° C. at sea level. It was thus impossible, in normal processes, to raise the resist temperature above the boiling point temperature of ECA and to eliminate the occurrence of heat loosening of the resist pattern. As an example thereof, the state of heat flow of a cross section of a novalak type resin resist pattern as seen under a scanning electron microscope, which heat flow was clarified by the present inventor, is shown in FIG. 4.

As shown in FIG. 4, in baking at 143° C. or lower, the shape of the resist is correctly preserved; however, in baking at temperatures greater than 149° C., the shape of the resist is gradually deformed. In this way, FIG. 4 shows that it is impossible to raise the baking temperature above that of the boiling point of the solvent.

In conducting research into methods allowing baking a high temperature without the occurrence of deformation, it was determined that if the UV curing is conducted in an atmosphere of an inert gas, heat flow does not occur even if baking is conducted at temperatures above the boiling point of the solvent.

That is to say, for example, by means of curing a G ray positive type resist (phenol novolak resin), for example, by conducting an UV curing process using ultraviolet rays with a wavelength of 250–300 nm in an atmosphere of an inert gas, it is possible to improve the temperature at which heat flow begins to more than 230° C.

As a result of continuing research in accordance with the above conclusion, a resist processing device and method were invented which caused absolutely no resist pattern deformation at temperatures which were higher than the boiling point of the resist solvent component, and moreover, caused almost no degassing from the resist. The results of experiments conducted using the above method and device are shown in FIG. 5. That is to say, a scanning electron microscope image of a resist pattern obtained by baking at a temperature of 230° C. in an atmosphere of an inert gas at normal atmospheric pressure after conducting UV curing by means of ultraviolet rays having a wavelength of 250–300 nm in an atmosphere of an inert gas at normal atmospheric pressure (hereinafter termed "UC baking"), for example, is shown in FIG. 5. FIG. 5 shows that the shape of the resist is not deformed despite raising the temperature to as much as 230° C.

Furthermore, the above research was also conducted on a resist membrane having no pattern formed thereon; however, the results thereof were that, as in the case of the above resist pattern, there was almost no degassing from the resist.

As a result of the research which was undertaken to attain the above object, it was discovered that, as a result of the low amount of degassing from the resist, it is important, in the device which radiates ultraviolet rays onto a substrate having a resist pattern formed thereon, to place the substrate which is irradiated with UV rays in an atmosphere of an inert gas. If the atmosphere in which the substrate which is to be irradiated with UV rays is placed does not comprise inert gas, the effects of the present invention cannot be sufficiently realized. Examples of this inert gas include, for example, $N_2$, Ar, Ne, He, and the like; of these, $N_2$ is preferable, as the results obtained therewith were striking. The amount of moisture contained in the inert gas which is introduced should be in an amount of tens of ppb or less (more preferably, less than single digit ppb), and should preferably be highly pure, containing as few impurities as possible. However, this gas is not necessarily so limited. The pressure of the inert gas atmosphere is preferably that of a standard atmosphere; at low pressures of less than tens of Torr, the degassing amount from the resist increases. Furthermore, the temperature of the substrate at the time of irradiation with UV rays should be a temperature at which the shape of the resist can be reliably maintained; for example, in the case of a G ray positive type resist, a temperature of roughly 130° C. is preferable.

Furthermore, because the degassing amount from the resist is reduced after the radiation of ultraviolet rays onto the substrate surface, it it important to provide a mechanism for heating the substrate so as to set the substrate temperature to a value higher than that at the time of irradiation with ultraviolet rays. In particular, it is effective to conduct processing at a temperature which is higher than the boiling point of the resist solvent which is the main component of degassing; for example, in the case of a G ray positive type resist, to conduct processing at a temperature higher than 156° C.

The UC baking temperature is higher than the boiling point temperature of the resist solvent; so long as the resist shape is accurately maintained, the higher the temperature, the smaller the amount of degassing.

Moreover, it is preferable to conduct the UC baking after ultraviolet irradiation not in an ambient air atmosphere, but rather in an atmosphere of an inert gas at normal atmospheric pressure.

Furthermore, at the time of high temperature baking after UV irradiation, it is preferable that high purity inert gas be introduced into the inert gas atmosphere at a speed of approximately 4 l/min. When low pressure is to be maintained, and preferably, when a low pressure state of less than $10^{-4}$ Torr, and more preferably, less than $10^{-5}$ Torr, is maintained, the effects of the present invention are exhibited to a greater degree.

1 ... UV ray source,
2 ... hot plate,
3 ... chamber,
4 ... gate valve,
5 ... conveyance arm,
6 ... turbo pump,
7 ... rotary oil pump,
8 ... nitrogen tunnel,
9 ... nitrogen nozzle.

DESCRIPTION OF THE PREFERRED EMBODIMENT

Figure 3:
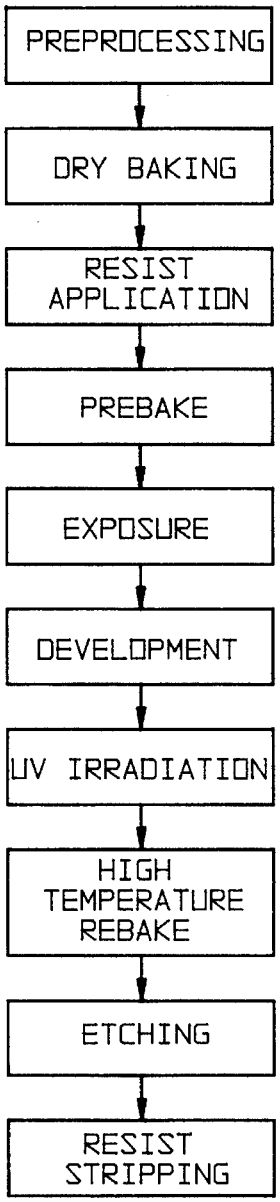
FIG. 3 is a process drawing of a method in which a further high temperature baking is carried out after the UV curing of the present invention.
Figure 4:
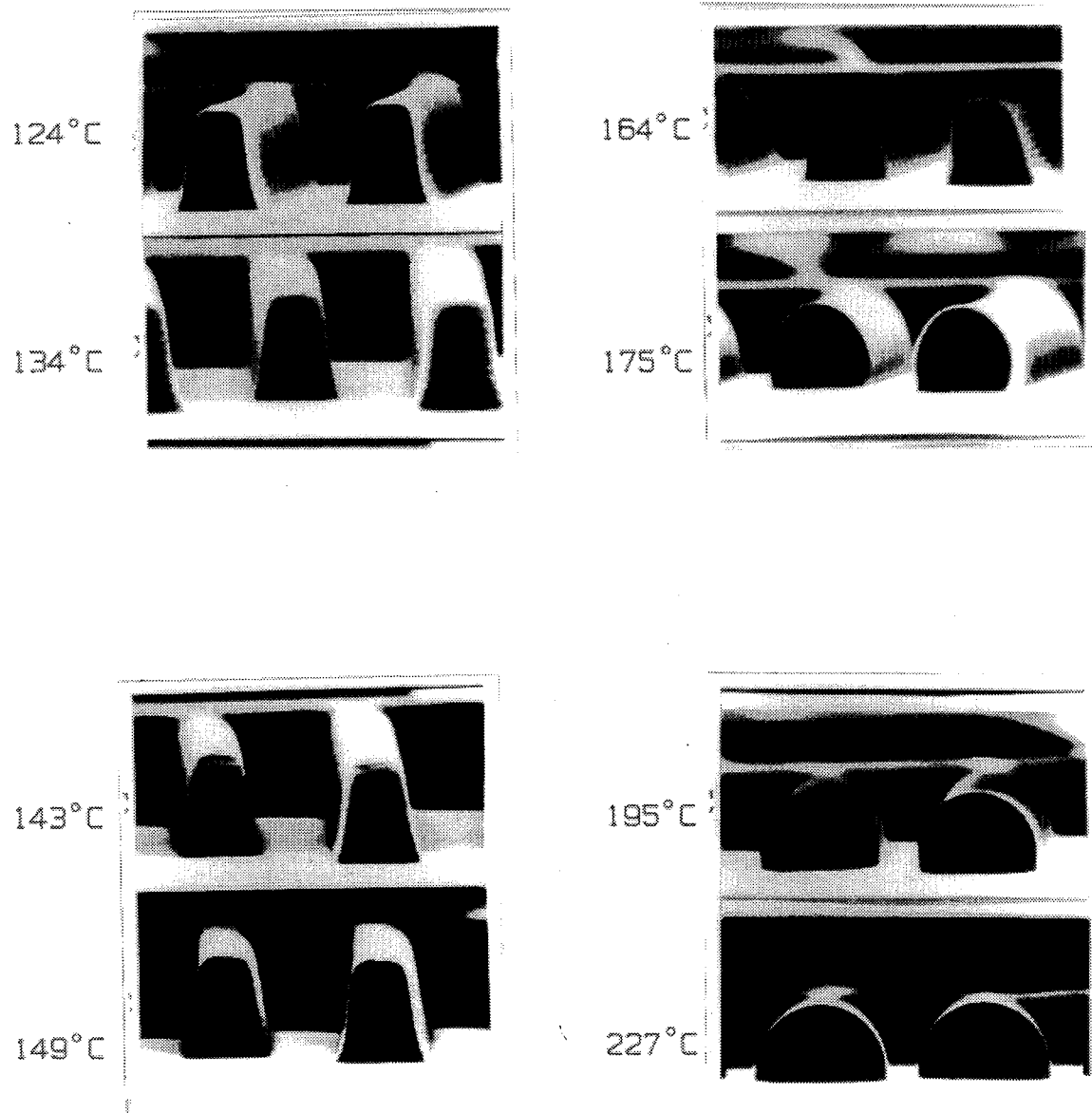
FIG. 4 is a series of scanning electron micrographs showing the heat flow state of a cross section of a resist pattern of a novolak type resin.
Figure 5:
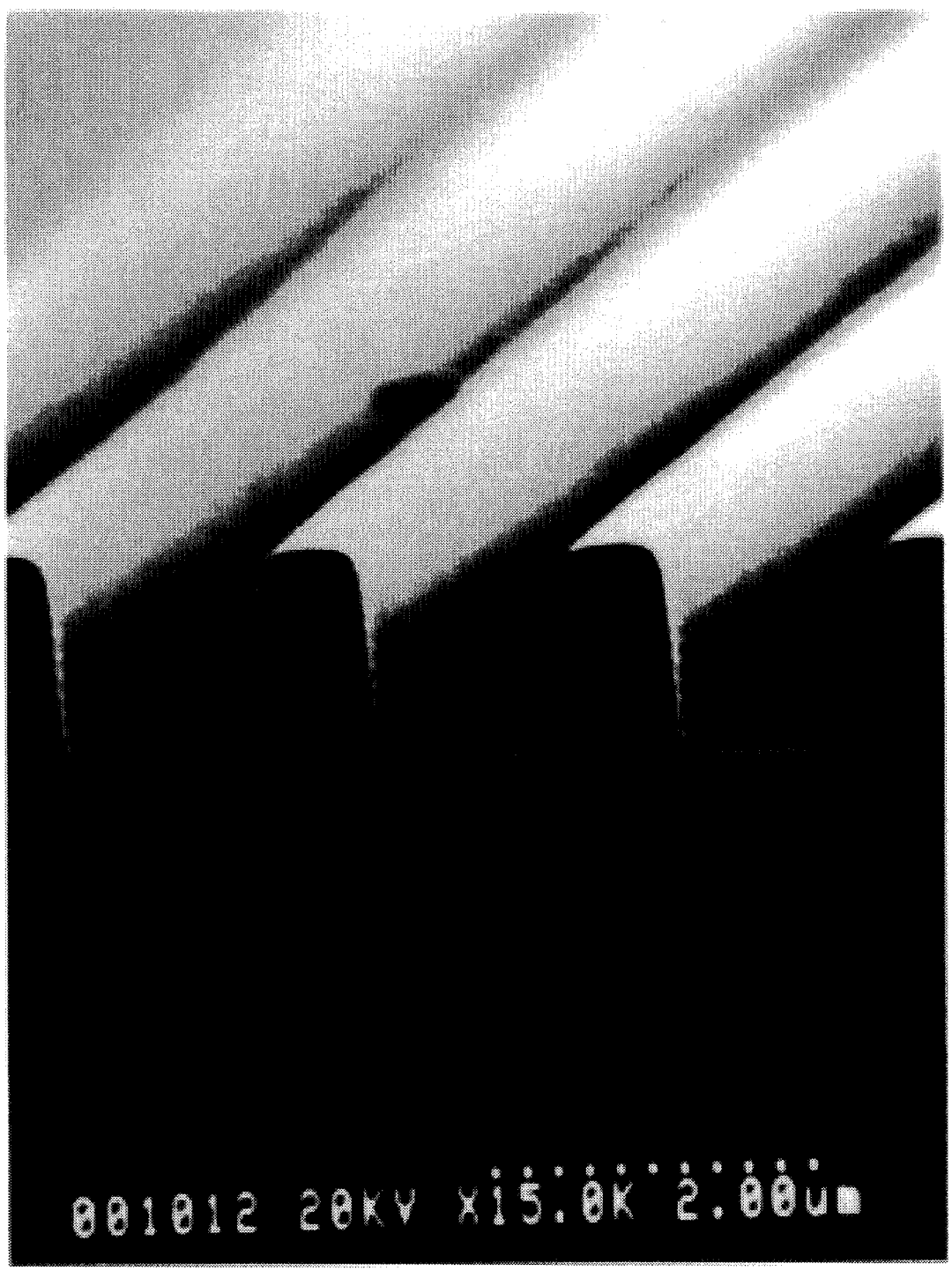
FIG. 5 is a scanning electron micrograph of a resist pattern obtained by conducting a further baking in a high temperature of up to 230° C. after UV curing in a nitrogen atmosphere at normal atmospheric pressure in accordance with the present invention.

Hereinbelow, examples of the present invention will be concretely explained with reference to the drawings. FIG. 3 is a photolithographic process drawing in which rebaking is conducted in the present invention after UV curing.

Figure 6:
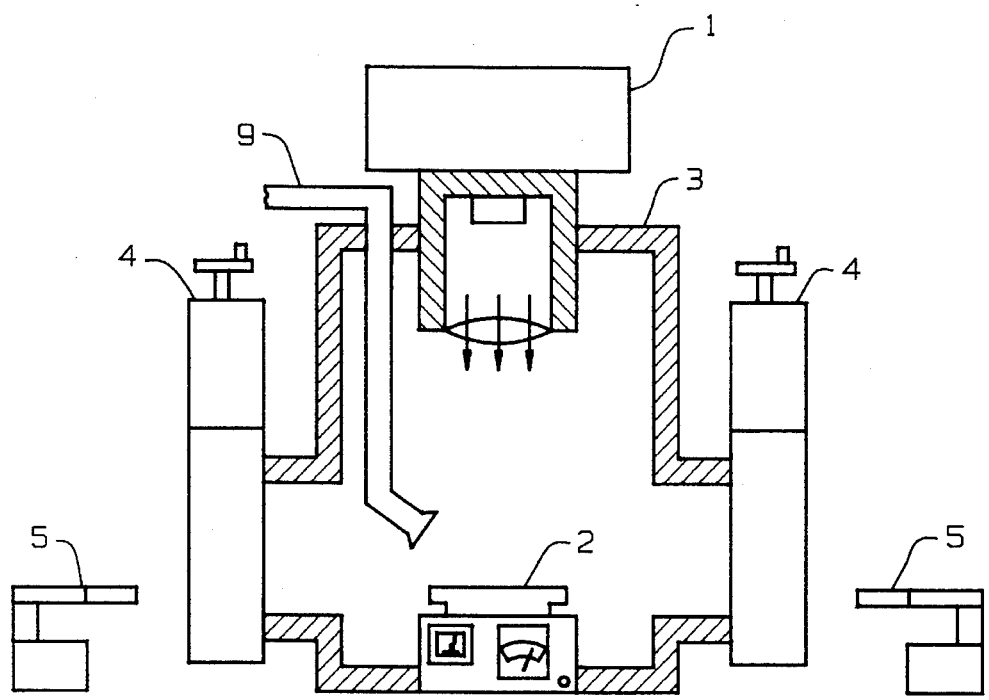
FIG. 6 is a cross sectional schematic diagram of a high temperature rebaking device which is used in the UV curing process and later processes used in the present invention.

The UV curing was conducted using a resist processing device such as that shown in FIG. 6. In the drawing, reference numeral 1 indicates an UV ray source, reference numeral 2 indicates a hot plate for heating the substrate, reference numeral 3 indicates a model SUS 316L chamber, the inner surface of which has been subjected to compound electrolytic polishing, reference numeral 4 indicates a gate valve for the inward and outward conveyance of the substrate, reference numeral 5 indicates a conveyance arm, and reference numeral 9 indicates an inert gas introduction pipe nozzle which is placed so that the inert gas flow is efficiently directed onto the surface of the substrate.

The developed substrate is sufficiently rinsed in water is then dried in nitrogen gas or the like, and is then conveyed into the UV chamber through gate valve 4 on a conveyance arm. The conveyance arm is a rear surface contact style conveyance arm. Prior to the placement of the substrate on hot plate 2, gate valve 4 is closed, the atmospheric gas is sufficiently replaced by an inert gas, the substrate is positioned on hot plate 2, and UV ray irradiation begins simultaneously. In order to prevent deformation of the resist pattern resulting from the temperature of the hot plate at this time, the temperature is set to a level lower than that of the usual post-baking temperature. After irradiation with UV rays of a fixed energy (for example, on the level of from hundreds of $mJ/cm^2$–1 s of $J/cm^2$), irradiation is stopped, the temperature of the hot plate is raised, and is maintained at a temperature which is higher than the boiling point of the solvent contained in the resist and lower than the heat deformation temperature of the resist after curing. The amount of UV radiant energy can be minimized by increasing the temperature of the substrate at the time of irradiation. Furthermore, the heat deformation initiation temperature after UV curing is approximately 250° C. By means of these operations, it is possible to obtain a resist pattern with almost no degassing.

Figure 7:
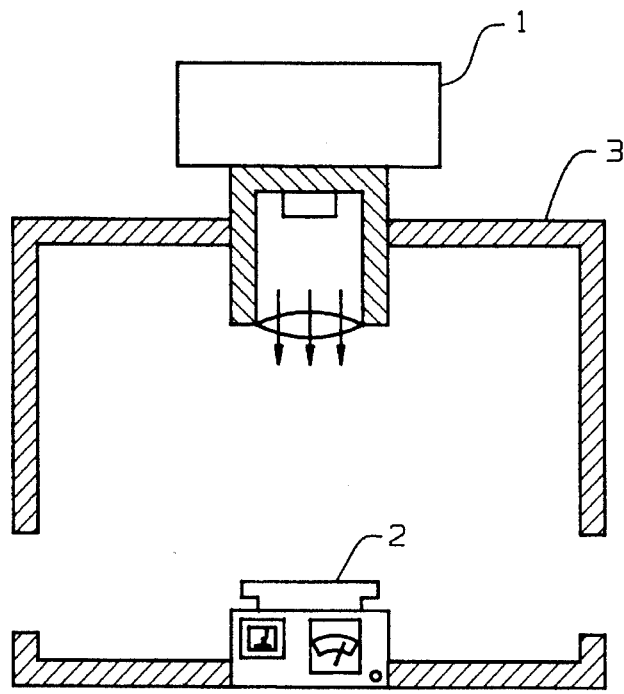
FIG. 7 is an example of a schematic diagram of a UV curing device which is currently widely used.

FIG. 7 shows an example of the most basic UV curing device which is currently in wide use.

Figure 8:
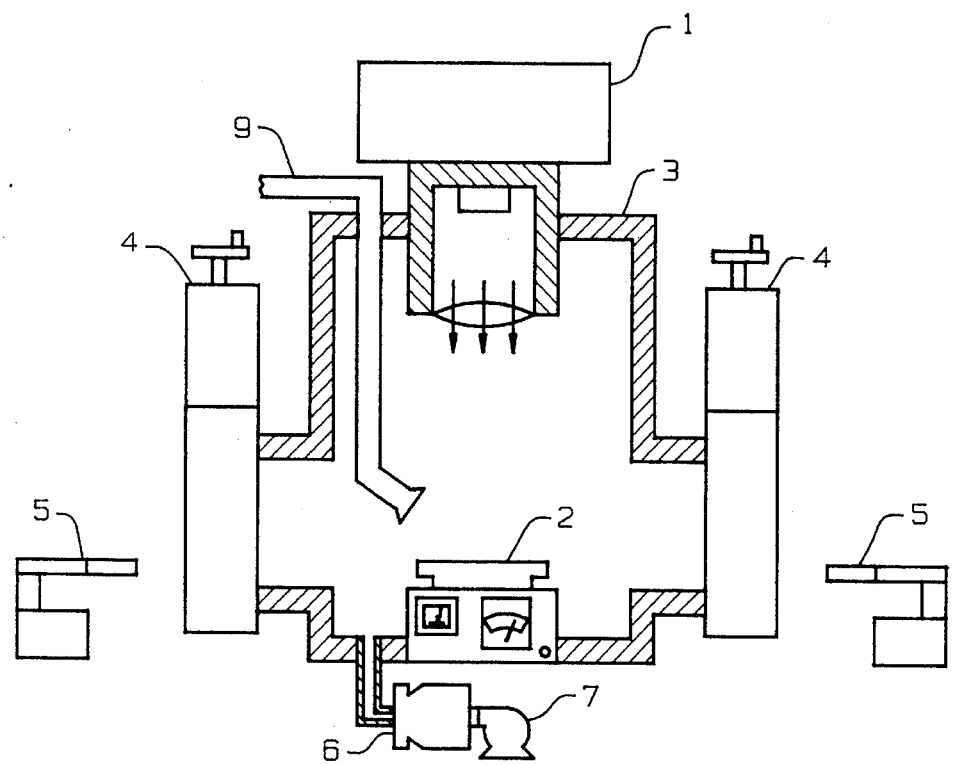
FIG. 8 is a cross sectional schematic diagram of a device, which is an application example of the present invention, which is provided with an evacuation system for the replacement of the atmosphere within the device chamber or so as to enable processing with a high degree of reduced pressure at the time of high temperature rebaking.

FIG. 8 shows an example of a device which is capable of instantaneously creating a high vacuum, by means of a magnetic levitation turbo-molecular pump or the like, in order to facilitate the complete replacement of the atmosphere by an inert gas prior to UV curing, or in order to facilitate the removal of degassing from the resist after UV curing in an atmosphere of an inert gas at normal atmospheric pressure. In the figure, reference numeral 6 indicates a vacuum pump such as a turbo-molecular pump or the like, and reference numeral 7 indicates a vacuum pump such as a rotary oil pump or the like.

Figure 9:
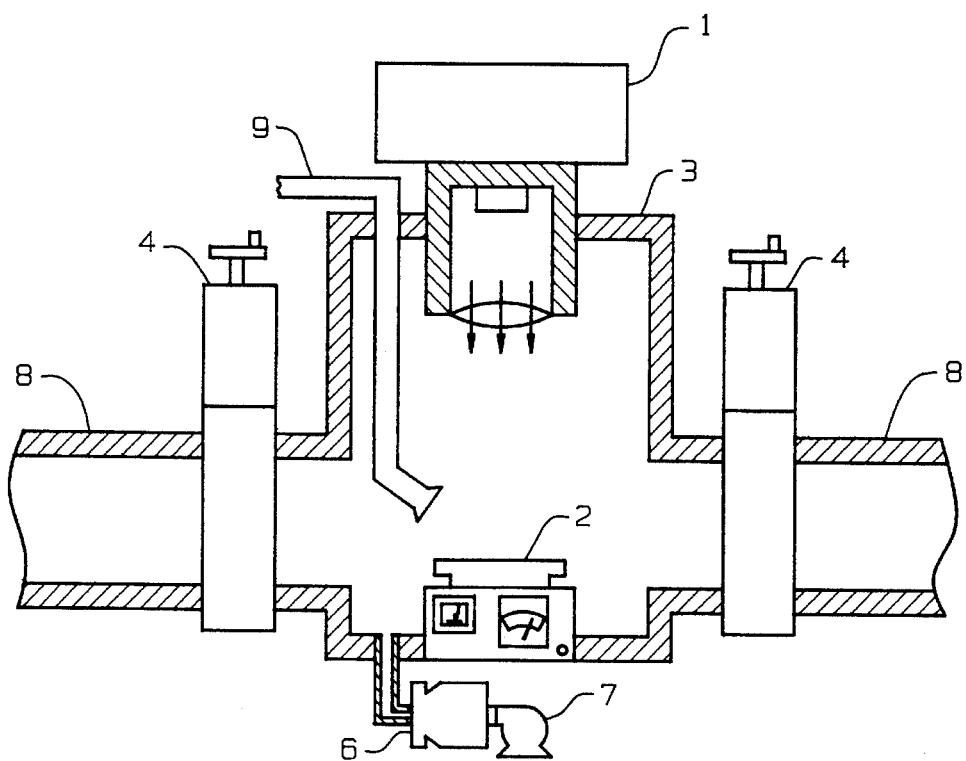
FIG. 9 is a cross sectional schematic diagram of a device, which is an application example, in which the device of the present invention and a substrate nitrogen tunnel conveyance device are docked.

FIG. 9 is an example of the structure of the system for a lithographic process using an inert gas tunnel. The docking of the device of the present invention with devices of the lithographic process which are in front and behind this device, and the common use thereof, present no problems; such devices are not necessarily restricted to those having a single structure. In FIG. 8, an inert gas tunnel for the conveyance of the substrate is shown.

The resist used in the present invention is not particularly restricted insofar as it reacts to light or radiation, and insofar as a resist pattern may be created thereon by means of the difference between exposed and unexposed portions; however, it is necessary that it possess UV curing processing effects. Furthermore, ultraviolet rays (UV rays) encompass the short wavelength ultraviolet (200–350 nm) and the near ultraviolet (350–400 nm); the wavelength thereof is not restricted. However, a wavelength is preferable which is within the wavelength band having a UV curing effect and which will penetrate the resist so as to reach the resist-substrate interface.

To give an example, in the case of a G ray positive type resist (phenol novolak resin), at wavelengths less than 250 nm, the UV rays make almost no penetration into the resist, while at wavelengths of more than 300 nm, almost no UV curing effects can be observed. Therefore, with respect to this type of resist, a wavelength in the 250–300 nm wavelength band is effective.

Example 1

In this example, explanation will be made of the case in which nitrogen gas was used as an example of the inert gas.

Figure 1:
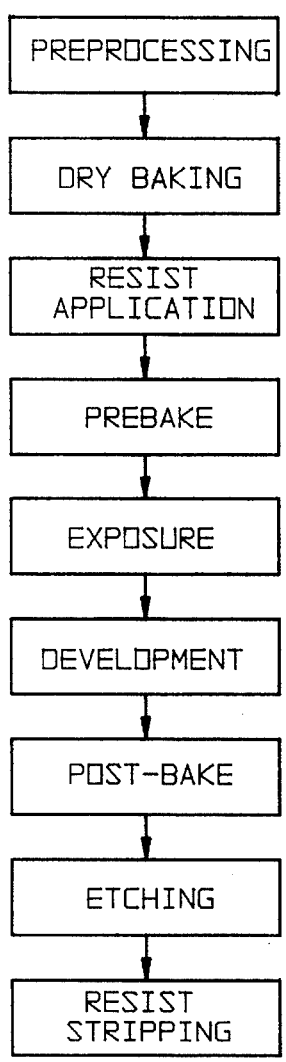
FIG. 1 is a process drawing showing the processing normally conducted in a photolithographic process.
Figure 2:
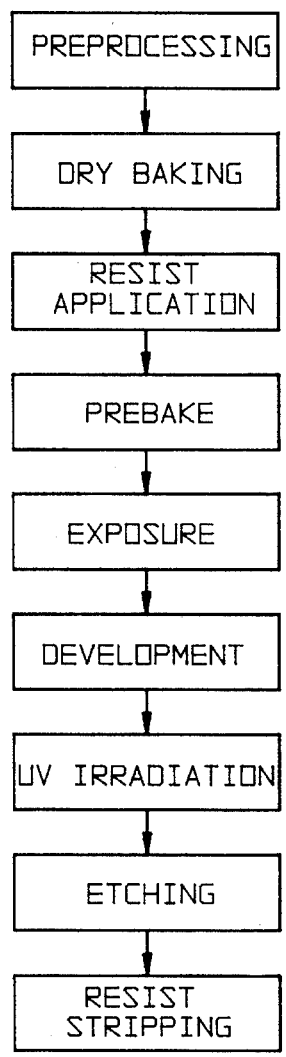
FIG. 2 is a process drawing in which is included UV curing processing which is generally conducted in photolithographic processes.

Following the processes shown in FIGS. 1–3, a 3-inch silicon wafer to which a resist (Tokyo Oka Chemicals, TSMR-8900) had previously been spin-applied at a thickness of 1.5 micrometers was exposed in a stepper (FPA1550M2, manufactured by Canon Corporation) with a 1.0 micrometer line and space pattern, dipping development was conducted in developing fluid (NMD-3, manufactured by Tokyo Oka Chemicals), and the processes shown in FIGS. 1–3 were conducted.

These samples were cut into 5 mm strips in one direction of the wafers, 3 of the above cut samples were inserted into a test column made from a ⅜ inch SUS316L tube, the interior surface of which was subjected to compound electrolytic polishing, and thereafter, the temperature was continuously raised to the temperature conditions at which measurements were to be conducted, and a degassing analysis was conducted in an atmospheric pressure ionization mass spectrometer (UG240A type, manufactured by Hitachi Tokyo Electronics Corporation; hereinafter termed APIMS) using argon (1 l/min) as a carrier gas.

The total surface area to which resist was applied on the inserted samples was approximately 11.2 cm$^2$. The replicability of the experiment was confirmed a number of times.

The results of the analysis are shown in Tables 1–3.

The figures in the tables represent relative ion intensities (%) of each component gas ion in the sample gas. Here, the relative ion intensity ($I_R$) was defined as the ratio of the object degassing component amount ($I_X$) to the total ion amount detected by APIMS ($I_T$).

$$I_R = (I_X/I_T) \times 100 \ (\%)$$

Here, increases or decreases in the degassing amount from the resist are in a 1:1 relationship to increases and decreases in the relative ion intensity defined above. That is to say, in the present example, increases and decreases in the relative ion intensity indicate increases and decreases in the resist degassing amount.

In all the tables, the farthest left-hand column shows the sample temperature at the time of degassing measurement. Item A indicates a process conducted at the standard post-baking temperature of the resist, 130° C., while item B indicates a process in which UV curing is conducted on the hot plate at a temperature of 130° C. Furthermore, item C indicates a process in which, after processing which is identical to that of item B, a further final bake is conducted at a temperature of 230° C., while item D indicates a process in which processing identical to that of item C is conducted in a complete atmosphere of nitrogen gas while nitrogen gas is being introduced.

Table 1 indicates the accumulated values of the relative ion intensity relating to the degassing of the moisture component from the resist. In the case of the normal baking method of item A and the simple UV curing of item B, an increase in degassing is apparent; however, in the case in which UC baking was conducted after conducting UV curing in a nitrogen atmosphere in accordance with the present invention, as shown in item D, this degassing value was essentially identical to that of the degassing component from the carrier gas. Even in comparison with the case in which UC baking was conducted after conducting UV curing in an air atmosphere at normal atmospheric pressure, as in item C, it is clear that the method of the present invention indicated by item D has a smaller degassing amount.

In the same manner, Table 2 shows the accumulated values of the relative ion intensities relating to the degassing of the solvent component (ECA) from the resist. As in the results of Table 1 above, in the case in which the method of the present invention indicated by item D was used, it was possible to reduce the degassing amount from the resist under various temperature conditions to a value of approximately 0.

Table 3 shows the accumulated values of the relative ion intensities relating to degassing caused by the disintegration of the resist resin itself from the resist. Results which are identical to those of Tables 1 and 2 above were obtained. In item D according to the present invention, it can be confirmed that the degassing amount was reduced even with respect to resist decomposition resulting from heat.

As a result of the comparison of these processes, it can be seen that in item D, which used a method and device using a nitrogen atmosphere in accordance with the present invention, in comparison with the conventional methods of items A and B, and in comparison with item C, in which UV and UC baking was conducted in an air atmosphere, the degassing amount of the resist was maintained at a very low level even at the high temperature of 230° C.

As a result, even if the resist is struck by ions at the time of dry etching, for example, it is possible to greatly reduce the degassing amount from the resist, and precise control of an extremely accurate etching pattern without a worsening of the etching atmosphere becomes possible. Furthermore, it is possible to reduce contamination resulting from the resist degassing component in the etching chamber.

Example 2

Using a method identical to that of Example 1, mass spectrum data was collected by means of APIMS regarding the degassing from the resist with respect to a method using a normal post-bake and a method in which UC baking processing is conducted after UV curing in a nitrogen atmosphere at normal atmospheric pressure in accordance with the present invention. The wafer temperature at this time was 200° C.

Figure 10:
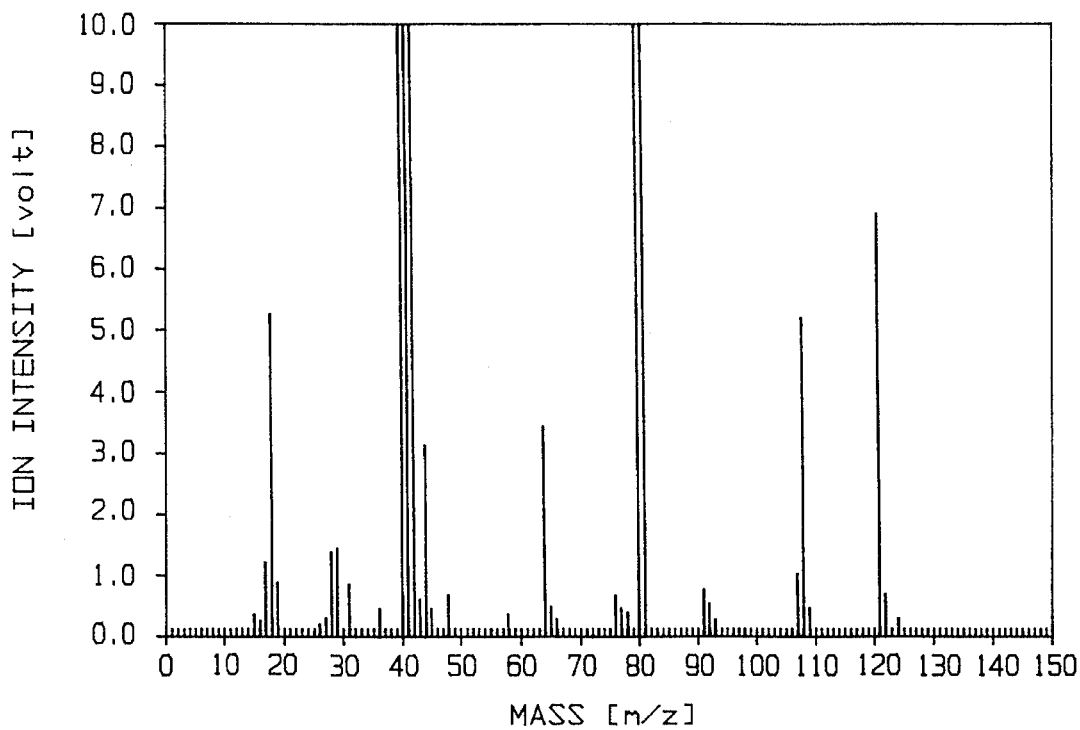
FIG. 10 is a mass spectrum taken at the time at which normal post-baking was conducted at a wafer temperature of 200° C.
Figure 11:
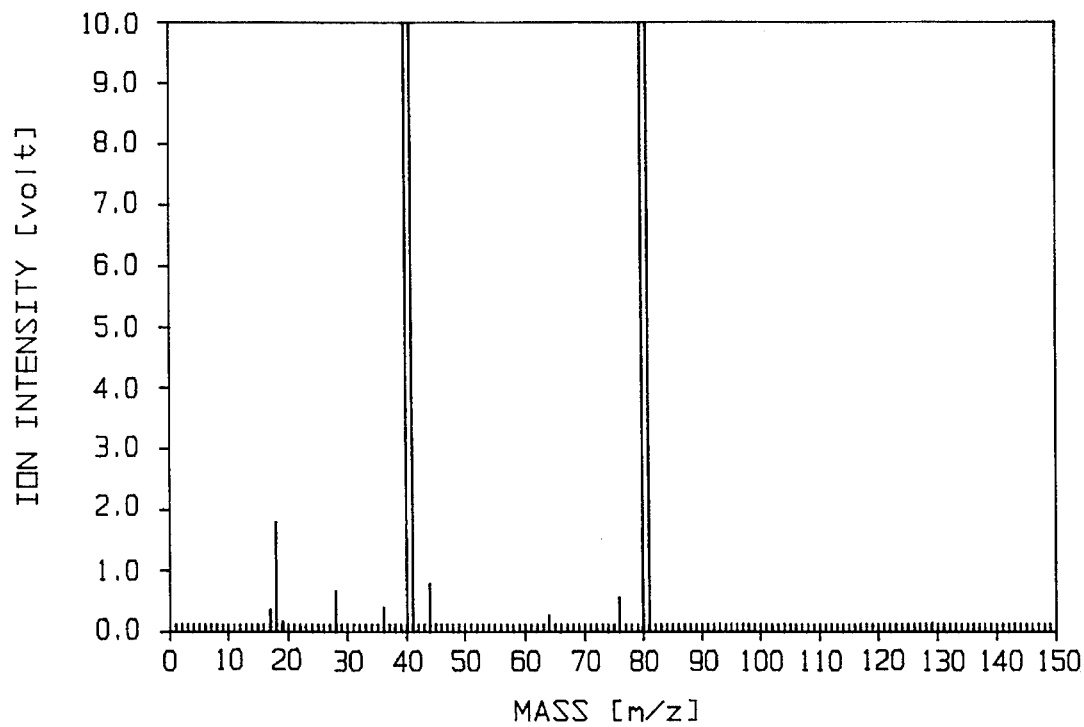
FIG. 11 is a mass spectrograph taken at the time of post-UV curing UC baking conducted in a nitrogen atmosphere at normal atmospheric pressure with a wafer temperature of 200° C. in accordance with the present invention.

FIG. 10 shows the mass spectrum at the time when normal post-baking is conducted, while FIG. 11 shows the mass spectrum at the time of UC baking which is conducted after the UV curing in an atmosphere of nitrogen gas at normal atmospheric pressure in accordance with the present invention. In the diagram, mass numbers are shown along the axis of the abscissa, while the intensity of the mass ions is shown in volts along the axis of the ordinate. The data of FIGS. 10 and 11 were measured under APIMS conditions which were exactly identical with respect to sensitivity and the like.

From the diagrams, it can be seen that almost no spectra could be detected in the case of the UC baking processing with the exception of the argon carrier gas mass (m/z)=36, 40, 41, 76, 80, 81; in contrast, a large number and great variety of spectra were detected in the case of processing by means of the normal baking; a moisture peak centered on m/z=18, a solvent peak centered on m/z=31 and 44, and resist resin peaks centered on m/z=64, 108, and 121, were detected.

Furthermore, when normal baking processing was carried out under the conditions of the present example, in which the temperature was continuously raised to 200° C., spectra data are obtained which show a limiting point for the solvent component after a large amount of solvent component degassing has occurred; however, in the case in which UC baking processing was conducted, no peaks can be observed during the period in which temperature was raised.

Example 3

The experiment relating to item D of the above examples was conducted at the time of final baking in a low pressure nitrogen flow.

Table 4 shows the accumulated values of the relative ion intensity relating to degassing of the solvent component from the resist. In the table, the respective columns indicate data relating to conditions of a nitrogen atmosphere at normal atmospheric pressure, at 20 Torr, at 30 mTorr, and at 0.03 mTorr. At 30 mTorr, a degassing suppression effects resulting from nitrogen are slight; however, by raising the degree of reduced pressure, it is possible to obtain effects identical to those of a nitrogen atmosphere at normal atmospheric pressure.

In the above examples, a case was shown in which nitrogen gas was used as the inert gas; however, in a case in which other inert gasses are used, results which are nearly identical to those of Examples 1–3 can be obtained.

Furthermore, examples were shown in which a semiconductor wafer (silicon wafer) was used as the substrate; however, it is clear that even in cases where other substrates, such as for example, a superconducting substrate, a conducting substrate, or an insulating substrate, are used, essentially the same effects will be obtained.

Effects of the Invention

By means of the present invention, it is possible to greatly reduce the degassing amount from the resist even when the resist is struck by, for example, ions at the time of dry etching, and furthermore, precise control of a highly accurate etching pattern without the contamination of the etching atmosphere becomes possible. Furthermore, contamination resulting from the resist degassing component in the etching chamber is reduced. As a result, it is possible to realize integrated component chips with a large surface area and a remarkably high degree of integration, for example, LSI chips, superconducting integrated component chips, and the like, and the potential for future useful applications in a field of manufacturing technology such as semiconductors, are numerous.

TABLE 1

Relative Ion Intensity [%] of the Moisture Degassing Component in Each Process

| °C. | A | B | C | D |
|---|---|---|---|---|
| 90 | 2 | 2 | 1 | <0.5 |
| 130 | 2 | 3 | 1 | <0.5 |
| 200 | 4 | 15 | 1.5 | <0.5 |
| 230 | 8 | 15 | 3 | 1 |

TABLE 2

Relative Ion Intensity [%] of Solvent Degassing Component in Each Process

| °C. | A | B | C | D |
|---|---|---|---|---|
| 90 | 2 | 2 | 1 | <0.5 |
| 130 | 2 | 10 | 1 | <0.5 |
| 200 | 4 | 35 | 1 | <0.5 |
| 230 | 5 | 22 | 3 | <0.5 |

TABLE 3

Relative Ion Intensity [%] of the Resist Resin Degassing Component in Each Process

| °C. | A | B | C | D |
|---|---|---|---|---|
| 90 | 0 | 0 | 0 | 0 |
| 130 | 0 | 0 | 0 | 0 |

TABLE 3-continued

Relative Ion Intensity [%] of the Resist Resin Degassing Component in Each Process

| °C. | A | B | C | D |
|---|---|---|---|---|
| 200 | 9 | 1.5 | 0 | 0 |
| 230 | 18.5 | 16 | 2.5 | <0.5 |

TABLE 4

Relative Ion Intensity [%] of the Resist Resin Degassing Component at Various Degrees of Reduced Pressure

| °C. | AIR | 20 TORR | 30 mTORR | 0.03 mTORR |
|---|---|---|---|---|
| 90 | 0 | 0 | 0 | 0 |
| 130 | 0 | 0 | 0 | 0 |
| 200 | 0 | 0 | <0.5 | 0 |
| 230 | <0.5 | <0.5 | 9 | <0.5 |

Possibilities for Use In Industry

By means of the present invention, it is possible to greatly reduce the degassing amount from the resist even when the resist is struck by, for example, ions at the time of dry etching, and furthermore, precise control of a highly accurate etching pattern without the contamination of the etching atmosphere becomes possible. Furthermore, contamination resulting from the resist degassing component in the etching chamber is reduced. As a result, it is possible to realize integrated component chips with a large surface area and a remarkably high degree of integration, for example, LSI chips, superconducting integrated component chips, and the like, and the potential for future useful applications in a field of manufacturing technology such as semiconductors, are numerous.

What is claimed is:

1. A resist processing method for forming a resist pattern, the method comprising the steps of 1) radiating ultraviolet rays onto a resist which is disposed on a substrate in an inert gas atmosphere after development of said resist, and 2) thereafter baking said resist at a temperature above 230° C.

2. The resist processing method in accordance with claim 1, wherein the pressure of said inert gas atmosphere is at atmospheric pressure.

3. The resist processing method in accordance with claim 1, in which said inert gas atmosphere has a moisture concentration which is less than 100 ppb.

4. The resist processing method in accordance with claim 1, wherein said inert gas atmosphere comprises nitrogen gas.

5. The resist processing method in accordance with claim 1, wherein said substrate comprises a semiconductor.

6. The resist processing method in accordance with claim 2, wherein the baking of said resist is conducted in an inert gas atmosphere.

7. The resist processing method in accordance with claim 6, wherein said inert gas atmosphere at the time of baking is at a pressure of less than $10^{-4}$ Torr.

8. The resist processing method in accordance with claim 6, wherein said inert gas atmosphere at the time of baking is at atmospheric pressure.

* * * * *

UNITED STATES PATENT AND TRADEMARK OFFICE
CERTIFICATE OF CORRECTION

PATENT NO. : 5,516,626
DATED : May 14, 1996
INVENTOR(S) : Tadahiro Ohmi et al

It is certified that error appears in the above-indentified patent and that said Letters Patent is hereby corrected as shown below:

On the title page, item [63] before the continuation insert --PCT/JP91/00538 Filed: April 23, 1991--

Signed and Sealed this

Twenty-fourth Day of September, 1996

Attest:

BRUCE LEHMAN

Attesting Officer

Commissioner of Patents and Trademarks